(12) United States Patent
Zimmermann et al.

(10) Patent No.: US 11,783,977 B2
(45) Date of Patent: Oct. 10, 2023

(54) MAGNETISM BOOSTER ASSEMBLY

(71) Applicant: MILWAUKEE ELECTRIC TOOL CORPORATION, Brookfield, WI (US)

(72) Inventors: Michael J. Zimmermann, New Berlin, WI (US); Marcus Wechselberger, Milwaukee, WI (US)

(73) Assignee: MILWAUKEE ELECTRIC TOOL CORPORATION, Brookfield, WI (US)

( * ) Notice: Subject to any disclaimer, the term of this patent is extended or adjusted under 35 U.S.C. 154(b) by 0 days.

(21) Appl. No.: 17/750,858

(22) Filed: May 23, 2022

(65) Prior Publication Data

US 2022/0285061 A1    Sep. 8, 2022

Related U.S. Application Data

(63) Continuation of application No. 16/515,803, filed on Jul. 18, 2019, now Pat. No. 11,342,101.

(60) Provisional application No. 62/701,204, filed on Jul. 20, 2018.

(51) Int. Cl.
| | |
|---|---|
| *H01F 13/00* | (2006.01) |
| *H01F 7/02* | (2006.01) |
| *H05K 5/02* | (2006.01) |

(52) U.S. Cl.
CPC ............. *H01F 7/02* (2013.01); *H01F 7/0221* (2013.01); *H01F 13/00* (2013.01); *H01F 13/003* (2013.01); *H05K 5/0217* (2013.01)

(58) Field of Classification Search
CPC .............................. H01F 7/0221; H01F 13/00
See application file for complete search history.

(56) References Cited

U.S. PATENT DOCUMENTS

| | | | |
|---|---|---|---|
| 1,353,761 | A | 9/1920 | Knoche |
| 3,133,568 | A | 5/1964 | Reed |
| 3,176,932 | A | 4/1965 | Kovaleski |
| 3,903,761 | A | 9/1975 | Runton |
| D244,808 | S | 6/1977 | Ubermuth |
| 4,269,246 | A | 5/1981 | Arson et al. |
| 5,024,759 | A | 6/1991 | McGrath et al. |
| D330,318 | S | 10/1992 | Snider |
| 5,515,754 | A | 5/1996 | Elkins |
| 5,724,873 | A | 3/1998 | Dillinger |
| 5,868,047 | A | 2/1999 | Faust et al. |
| D428,106 | S | 7/2000 | Yamaguchi |
| 6,154,108 | A | 11/2000 | Huang |

(Continued)

FOREIGN PATENT DOCUMENTS

| | | |
|---|---|---|
| DE | 4300446 A1 | 6/1994 |
| EP | 2527066 A2 | 11/2012 |

(Continued)

OTHER PUBLICATIONS

European Patent Office Extended Search Report for Application No. 19192364.8 dated Jan. 30, 2020 (7 pages).

*Primary Examiner* — Ramon M Barrera
(74) *Attorney, Agent, or Firm* — Michael Best & Friedrich LLP

(57) ABSTRACT

A magnetism booster assembly includes a body having a first end and a second end. The body defines a bore and a cavity formed separately from the bore. The bore extends between the first end and the second end. The cavity has a first opening adjacent the first end of the body and a second opening adjacent the second end of the body. The magnetism booster assembly also includes a magnet positioned within the cavity.

21 Claims, 8 Drawing Sheets

SECTION A-A

(56) References Cited

U.S. PATENT DOCUMENTS

| | | |
|---|---|---|
| 6,209,426 B1 | 4/2001 | Takahashi |
| 6,249,199 B1 | 6/2001 | Liu |
| 6,289,541 B1 | 9/2001 | Anderson et al. |
| 6,311,989 B1 | 11/2001 | Rosanwo |
| D457,046 S | 5/2002 | Boyle et al. |
| D457,797 S | 5/2002 | Huang |
| 6,530,299 B1 | 3/2003 | Liu |
| 6,722,667 B2 | 4/2004 | Cantlon |
| 6,761,361 B2 | 7/2004 | Taylor et al. |
| D497,300 S | 10/2004 | Chen |
| 6,877,402 B1 | 4/2005 | Pigford et al. |
| 6,883,405 B2 | 4/2005 | Strauch |
| 6,931,967 B1 | 8/2005 | Chang |
| 7,097,398 B2 | 8/2006 | Hernandez, Jr. |
| 7,107,882 B1 | 9/2006 | Chang |
| 7,159,493 B1 | 1/2007 | Huang |
| 7,225,710 B2 | 6/2007 | Pacheco, Jr. |
| 7,261,023 B2 | 8/2007 | Taguchi |
| 7,469,909 B2 | 12/2008 | Strauch et al. |
| 7,574,946 B1 | 8/2009 | Chang |
| D615,380 S | 5/2010 | Su |
| D623,036 S | 9/2010 | DeBaker |
| D631,723 S | 2/2011 | DeBaker |
| 7,922,180 B2 | 4/2011 | Meng |
| D644,903 S | 9/2011 | Chen |
| D646,138 S | 10/2011 | Hsu |
| D648,607 S | 11/2011 | Tanger |
| D655,369 S | 3/2012 | Hafner |
| 8,132,990 B2 | 3/2012 | Bauman |
| 8,176,817 B2 | 5/2012 | Liu |
| 8,291,795 B2 | 10/2012 | Hughes et al. |
| 8,366,356 B2 | 2/2013 | Novak et al. |
| 8,616,097 B2 | 12/2013 | Hughes et al. |
| 8,864,143 B2 | 10/2014 | Lin |
| D725,984 S | 4/2015 | Moss et al. |
| D726,521 S | 4/2015 | Moss et al. |
| 9,132,534 B2 | 9/2015 | Lai |
| D752,408 S | 3/2016 | Moss et al. |
| 9,314,909 B2 | 4/2016 | Vaamonde Coton et al. |
| D759,459 S | 6/2016 | Thomson |
| D764,251 S | 8/2016 | Hsu |
| 9,406,423 B1 | 8/2016 | Tsai |
| 9,505,108 B2 | 11/2016 | Peters |
| D789,761 S | 6/2017 | Moss et al. |
| 10,150,205 B2 | 12/2018 | Santamarina et al. |
| D838,566 S | 1/2019 | Moss et al. |
| D841,425 S | 2/2019 | Moss et al. |
| 2004/0093997 A1 | 5/2004 | Huang |
| 2005/0098002 A1 | 5/2005 | Holland-Letz |
| 2005/0166725 A1 | 8/2005 | Chen |
| 2006/0278050 A1 | 12/2006 | Hsiao |
| 2007/0234856 A1 | 10/2007 | Liu |
| 2009/0139378 A1 | 6/2009 | Chiang et al. |
| 2009/0174157 A1 | 7/2009 | Chang |
| 2009/0288525 A1 | 11/2009 | Chen |
| 2010/0011918 A1 | 1/2010 | Ray |
| 2010/0219594 A1 | 9/2010 | Nash |
| 2010/0307298 A1 | 12/2010 | Lai |
| 2011/0197721 A1 | 8/2011 | Debaker |
| 2012/0160064 A1 | 6/2012 | Moss et al. |
| 2015/0202751 A1 | 7/2015 | Chen |
| 2016/0016298 A1 | 1/2016 | Zhang |
| 2016/0023333 A1 | 1/2016 | Chen |
| 2016/0271768 A1 | 9/2016 | Zhang |
| 2016/0279769 A1 | 9/2016 | Arslan |
| 2016/0325411 A1 | 11/2016 | Wang |
| 2017/0120428 A1 | 5/2017 | Wang |
| 2018/0354102 A1 | 12/2018 | Kukucka et al. |
| 2019/0291246 A1 | 9/2019 | Wang |

FOREIGN PATENT DOCUMENTS

| | | |
|---|---|---|
| GB | 950544 A | 2/1964 |
| WO | 2005042210 A1 | 5/2005 |
| WO | 2006111447 A1 | 10/2006 |
| WO | 2008043514 A1 | 4/2008 |
| WO | 2012110453 A1 | 8/2012 |
| WO | 2017055657 A1 | 4/2017 |
| WO | 2018098700 A1 | 6/2018 |

SECTION A-A

SECTION B-B

SECTION C-C

MAGNETISM BOOSTER ASSEMBLY

CROSS REFERENCE TO RELATED APPLICATIONS

This application is a continuation of U.S. patent application Ser. No. 16/515,803, filed Jul. 18, 2019, now U.S. Pat. No. 11,342,101, which claims priority to U.S. Provisional Patent Application No. 62/701,204, filed Jul. 20, 2018, the entire contents of both of which are incorporated herein by reference.

BACKGROUND

The present invention relates to a magnetism booster assembly.

Power tools and hand tools alike are used to rotate and fasten screws and other fasteners. A driver bit used to fasten fasteners typically includes a shaft with a tip that contacts a head of the fastener. In some constructions, the tip may be magnetic to help maintain engagement with the head. Likewise, some screwdrivers may include tips that are magnetic to help maintain engagement with fasteners. However, magnetic tips are often not strong enough to fully retain the fastener.

SUMMARY

In one embodiment, the invention provides a magnetism booster assembly including a sleeve having a first face, a second face, and an outer periphery surface extending between the first face and the second face. The sleeve defines a central bore extending from the first face to the second face. The sleeve also defines a pocket spaced apart from the central bore and having an opening in the first face. The magnetism booster assembly also includes a magnet positioned within the pocket.

In another embodiment, the invention provides a magnetism booster assembly including a sleeve with a first face, a second face, and an outer periphery surface that extends between the first and second faces. The sleeve defines a central bore that extends from the first face to the second face. The central bore defines a center axis and includes an inside surface. The sleeve further includes a rib that extends from the inside surface towards the center axis. The rib is configured to engage a shaft of a tool. The magnetism booster assembly also includes a magnet supported by the sleeve.

In another embodiment, the invention provides a magnetism booster assembly including a flexible sleeve with a first face, a second face, and an outer periphery surface extending between the first face and the second face. The flexible sleeve defines a central bore extending between the first face and the second face. The magnetism booster assembly also includes a first magnet supported by the flexible sleeve and spaced apart from the central bore and a second magnet supported by the flexible sleeve and spaced apart from the central bore. The second magnet is positioned on a diametrically opposite side of the central bore from the first magnet.

Other aspects of the invention will become apparent by consideration of the detailed description and accompanying drawings.

DETAILED DESCRIPTION

Figure 1:
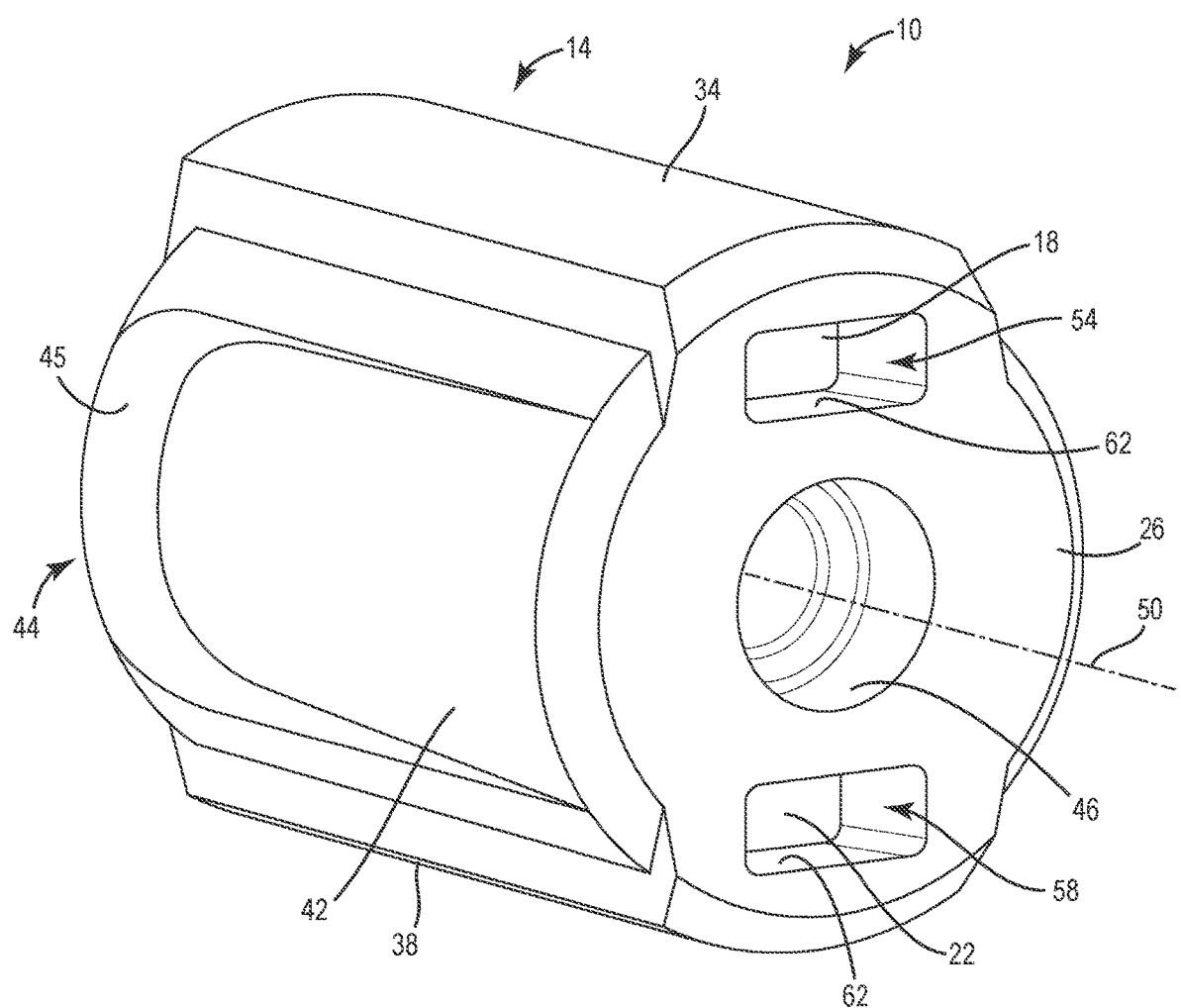
FIG. 1 is a perspective view of a magnetism booster assembly.
Figure 2:
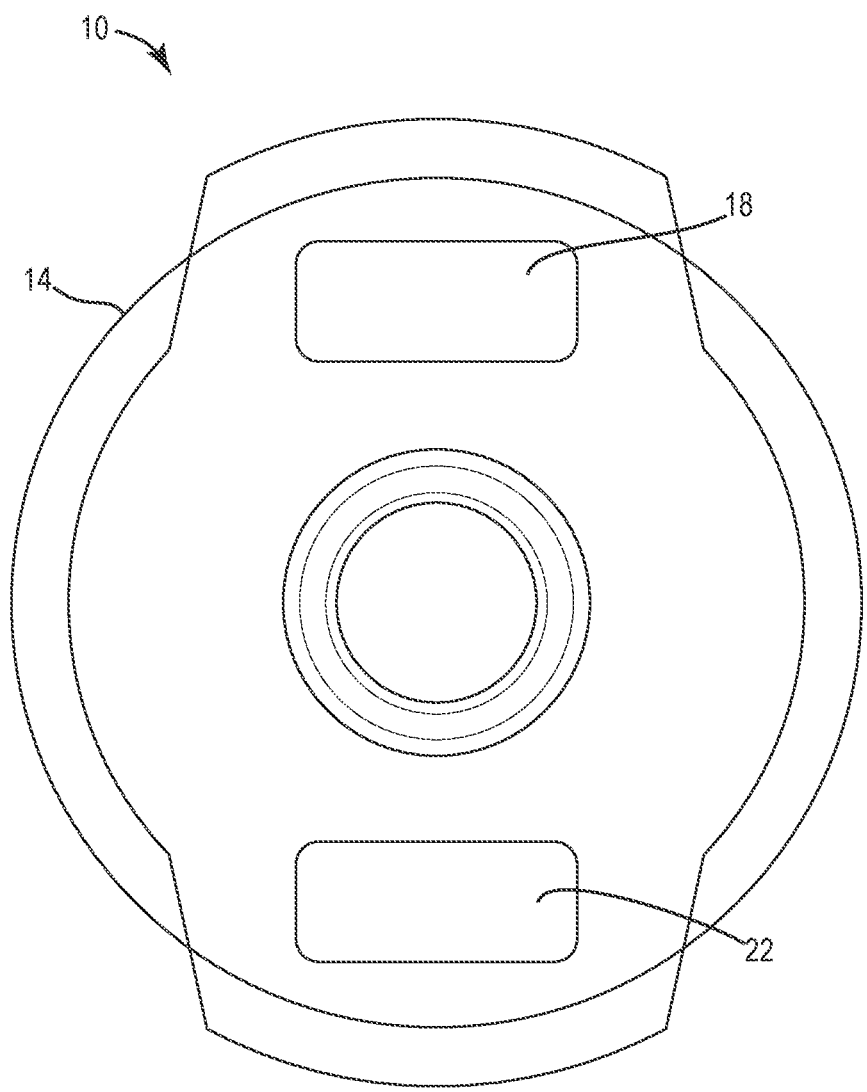
FIG. 2 is a front end view of the magnetism booster assembly of FIG. 1.
Figure 3:
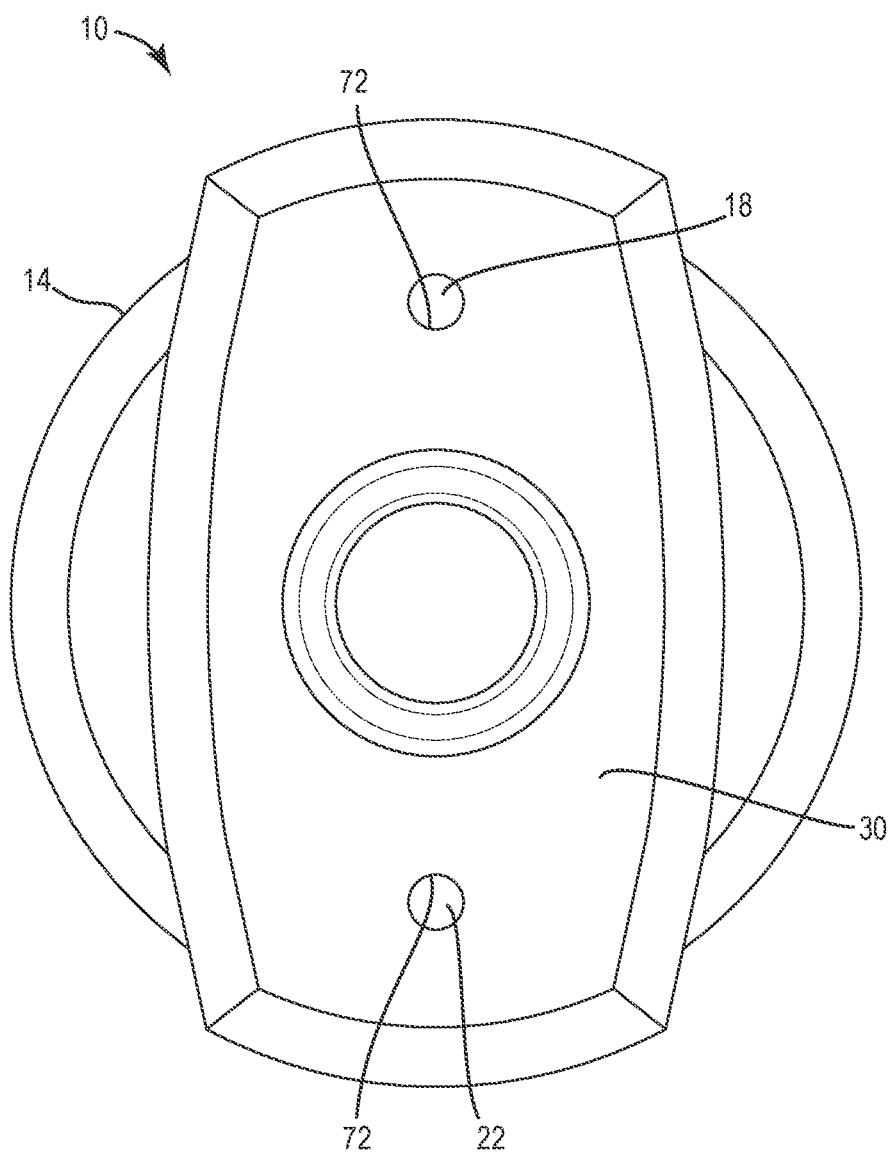
FIG. 3 is a rear end view of the magnetism booster assembly of FIG. 1.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

FIGS. 1-8 illustrate a magnetism booster assembly 10. The illustrated magnetism booster assembly 10 can be selectively coupled to a shaft of a tool, such as a driver bit or a screwdriver, to increase the magnetism of a tip of the tool for engaging a fastener (e.g., screw, bolt, nail, or the like) with the tip. In other embodiments, the magnetism booster assembly 10 may be used with other types of power tools or hand tools to boost the magnetism of the tools.

With reference to FIGS. 1-4, the magnetism booster assembly 10 includes a sleeve 14, a first magnet 18, and a second magnet 22. Although the illustrated assembly 10 includes two magnets 18, 22, in other embodiments, the assembly 10 may include only one magnet. Alternatively, the assembly 10 may include three or more magnets.

Figure 5:
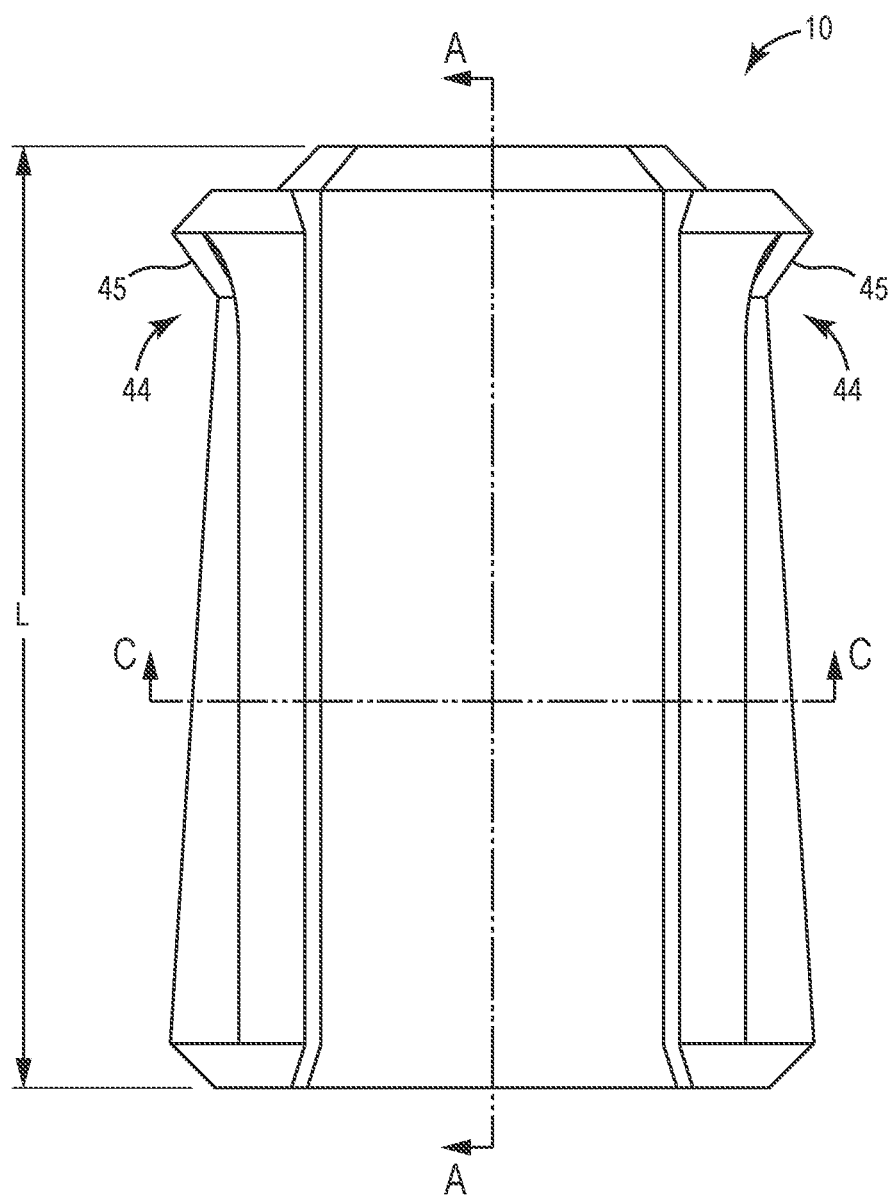
FIG. 5 is a side view of the magnetism booster assembly of FIG. 1.

Now referencing FIG. 1, the sleeve 14 is generally circular and includes a first or front face 26, a second or rear face 30 (FIG. 3) opposite the front face 26, an upper ridge 34, a lower ridge 38, and an outer periphery surface 42. The upper ridge 34, the lower ridge 38, and the outer periphery surface 42 extend between the front face 26 and the rear face 30. The outer periphery surface 42 is tapered from the front face 26 to the rear face 30 to define gripping portions 44 (FIG. 5). In other words, an outer dimension of the sleeve 14 gradually decreases from the front face 26 then abruptly increases near the rear face 30 to form projections 45. The gripping portions 44 with the projections 45 assist a user in removal and installation of the magnetism booster 10 on a tool. The sleeve 14 has a length L (FIG. 5) measured between the front face 26 and the rear face 30. In the illustrated embodiment, the length L is approximately 22 mm. In other embodiments, the length L may be greater than or less than 22 mm. In further embodiments, the length L may be within a range between 16 mm and 28 mm.

The sleeve 14 defines a centrally located bore 46 that extends from the front face 26 to the rear face 30. The bore 46 defines a center axis 50 of the sleeve 14 that extends from the front face 26 to the rear face 30. The bore 46 is configured to receive a shaft of a tool. The sleeve 14 also defines a pair of pockets (e.g., a first or upper pocket 54 and a second or lower pocket 58). The pockets 54, 58 are spaced apart from the bore 46 on diametrically opposite sides of the center axis 50. The pockets 54, 58 retain the first and second magnets 18, 22, respectively. The illustrated pockets 54, 58 have a generally rectangular cross-section. In the illustrated embodiment, the sleeve 14 includes two pockets 54, 58 that retain two magnets 18, 22 (one magnet in each pocket). In other embodiments, the sleeve 14 may include more than or less than two pockets to retain more than or less than two magnets. The first and second pockets 54, 58 both include an opening 62 on the front face 26 that allows access to the interior of the pockets 54, 58.

Figure 6:
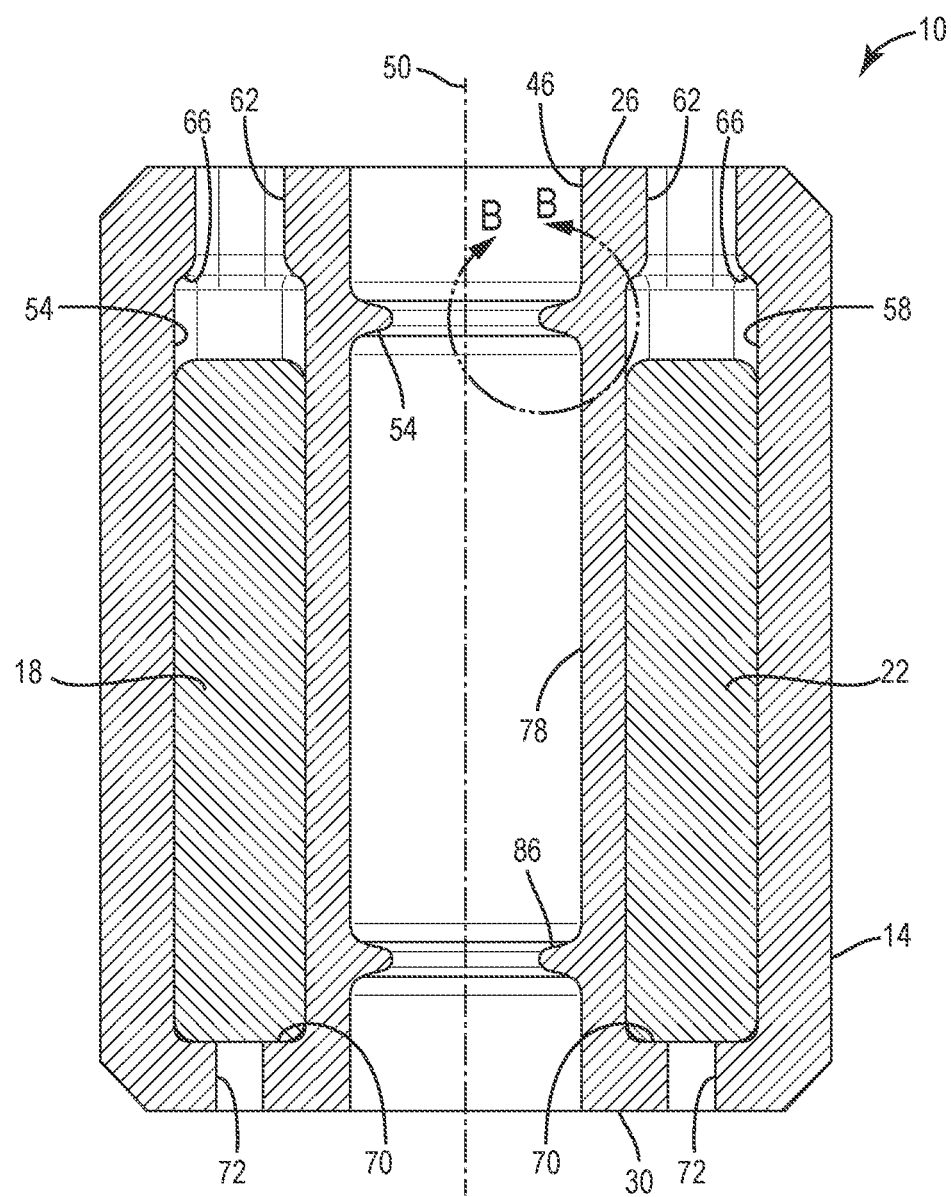
FIG. 6 is a cross-sectional view of the magnetism booster assembly taken along section line A-A of FIG. 5.
Figure 7:
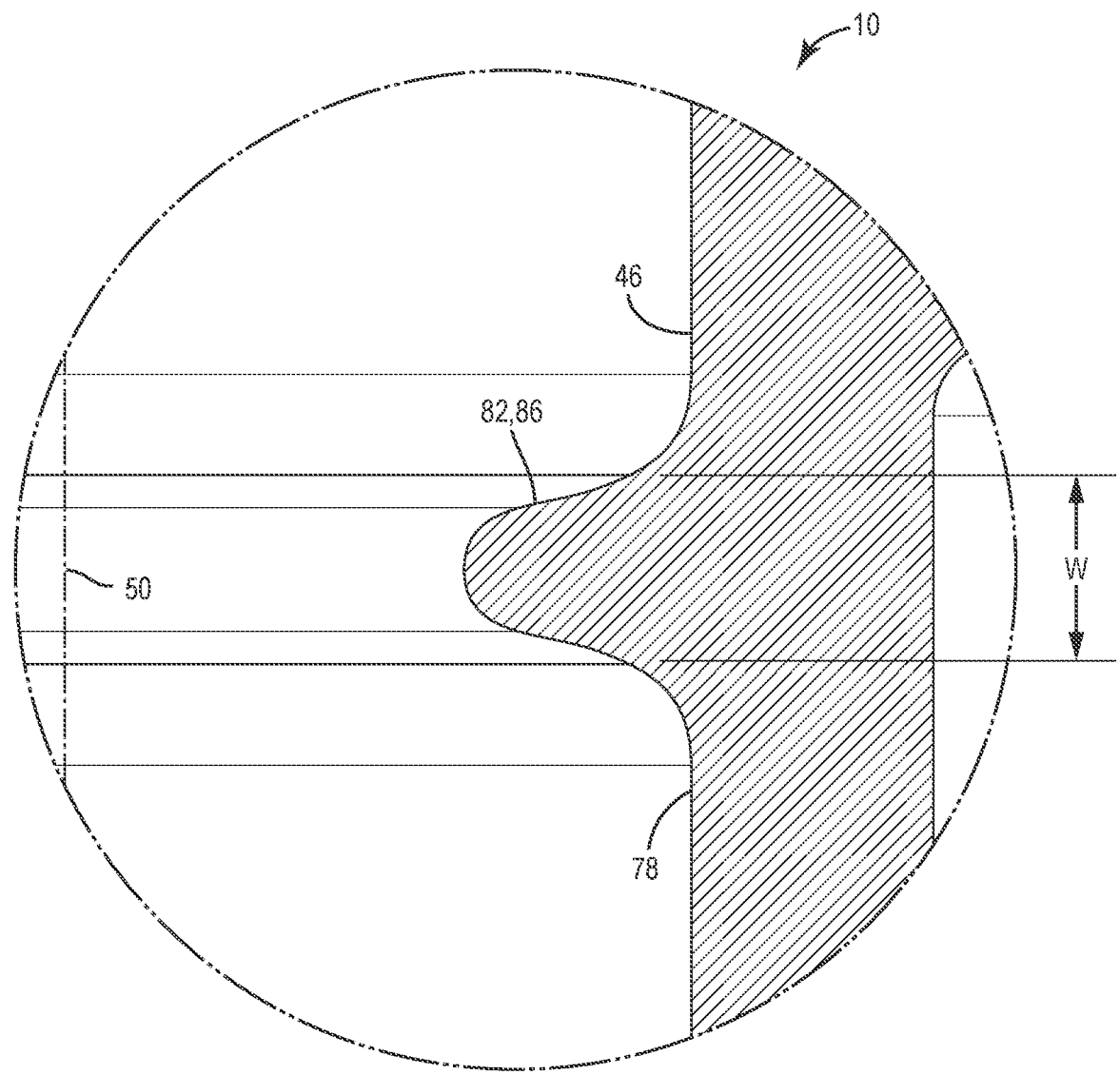
FIG. 7 is a detailed view of section B-B of the magnetism booster assembly of FIG. 6
Figure 8:
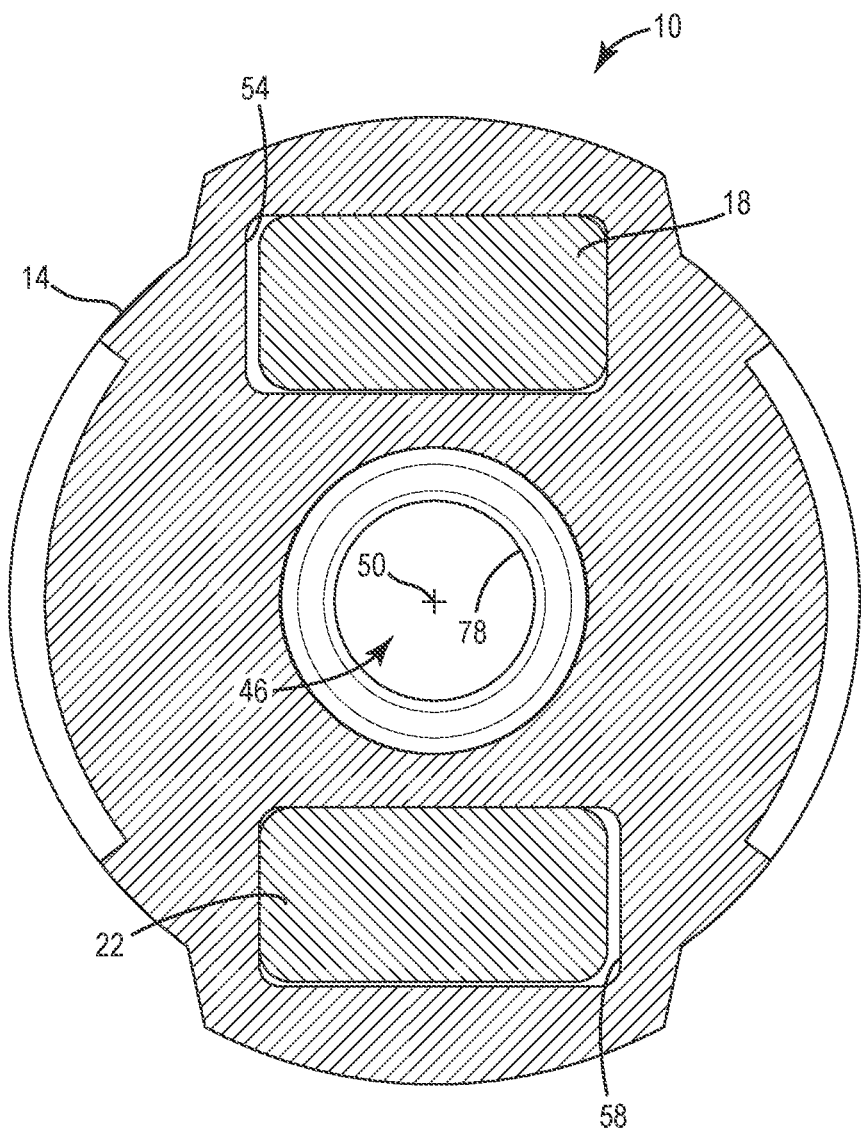
FIG. 8 is a cross-sectional view of the magnetism booster assembly taken along section line C-C of FIG. 5.

With reference to FIG. 6, the openings 62 are smaller than the pockets 54, 58. In the illustrated embodiment, the openings 62 are approximately 1 mm smaller in a width direction and a length direction compared to a corresponding length and a corresponding width of the pockets 54, 58. As such, the openings 62 define a lip or shoulder 66 that helps retain the magnets 18, 22 within the pockets 54, 58. The pockets 54, 58 are also defined by a back surface 70 of the sleeve 14 that acts as a stop for the magnets 18, 22. Apertures 72 extend through the back surface 72 to the rear face 30 of the sleeve 14 in each of the pockets 54, 58. The apertures 72 allow air to escape while the magnets 18, 22 are being inserted into the pockets 54, 58. The apertures 72 also facilitate removing the magnets 18, 22 from the pockets 54, 58 by allowing a relatively thin object (e.g., a nail) to be inserted through the apertures 72 to push the magnets 18, 22). As shown, the length of the magnets 18, 22 in a direction parallel to the center axis 50 is smaller than the length of the pockets 54, 58 in a direction parallel to the center axis 50. As such, magnets of different lengths may be retained inside the pockets 54, 58. In other embodiments, the length of the magnets 18, 22 may be the same as the length of the pockets 54, 58.

With continued reference to FIG. 6, the sleeve 14 includes two ribs 82, 86 extending into the central bore 46. The ribs 82, 86 extend circumferentially around an inside surface 78 that defines the bore 46 toward the center axis 50. The first rib 82 is positioned adjacent the front face 26 of the sleeve 14, and the second rib 86 is positioned adjacent the rear face 30 of the sleeve 14. Moving on to FIG. 7, each rib 82, 86 extends from the inside surface 78 approximately 2 mm and has a width W that is approximately 1 mm. In other embodiments, the ribs 82, 86 may extend further than or less than 2 mm from the inside surface 78. In further embodiments, the ribs 82, 86 may extend within a range between 1 mm and 3 mm from the inside surface 78. Similarly, the ribs 82, 86 may have a width W that is greater than or less than 1 mm or within a range from 0.5 mm to 2 mm. The ribs 82, 86 engage the shaft of a tool to help retain the sleeve 14 on the shaft. The ribs 82, 86 also accommodate a variety of driver sizes (e.g., widths, diameters, etc.) and shapes (e.g., cylindrical, hexagonal, oblong, etc.) of tool shafts.

In the illustrated embodiment, the sleeve 14 is made of a silicone material. For example, the sleeve 14 may be made of a silicon material having a hardness on the Shore A scale between durometer 50 and 60. The silicone is flexible and durable and allows the inside surfaces of the pockets 54, 58 to conform to the shapes of the magnets 18, 22 to help retain the magnets 18, 22 inside the pockets 54, 58. For example, the silicone allows the openings 62 to deflect and expand to receive the magnets 18, 22. Similarly, the silicone allows the central bore 46 and the ribs 82, 86 to conform to different sized and shaped tool shafts to retain the sleeve 14 on the tool. In other embodiments, sleeve 14 may be made of a material having hardness greater than or less than durometer 50-60. In further embodiments, the sleeve 14 may be made from a different material (e.g., rubber, elastomeric material, plastic, etc.).

Figure 4:
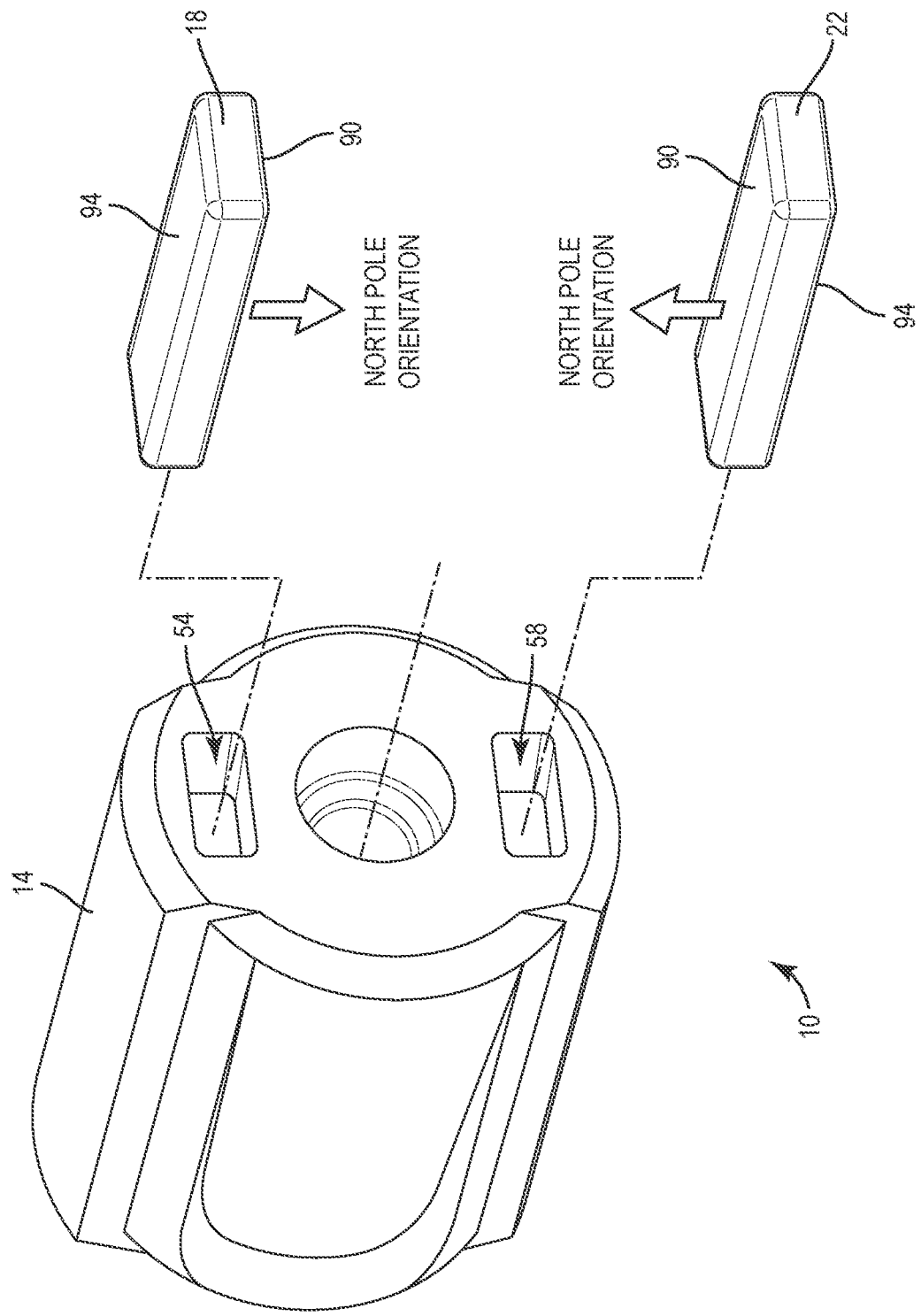
FIG. 4 is an exploded view of the magnetism booster assembly of FIG. 1.

With reference to FIG. 4, the magnets 18, 22 are permanent magnets with a north pole side 90 and a south pole side 94. In other embodiments, the magnets 18, 22 may be ferromagnetic elements that magnetically couple to a magnetic field created by a corresponding permanent magnet. The magnets 18, 22 have a generally rectangular cross-sectional shape, corresponding to the cross-sectional shape of the pockets 54, 58. The magnets 18, 22 are inserted into their respective pocket 54, 58 in a direction parallel to the center axis 50. The first magnet 18 is positioned in the upper pocket 54 with the north pole side 90 facing down, and the second magnet 22 is positioned in the lower pocket 58 with the north pole side 90 facing up. In other words, the magnets 18, 22 are positioned inside the pockets 54, 58 respectively with the north pole sides 90 facing each other. Alternatively, the magnets 18, 22 may be placed inside the pockets 54, 58, respectively, with the south pole sides 94 facing each other. With the north pole 90 sides facing each other, a strong magnetic field is created between the two magnets 18, 22. Specifically, a strong magnetic field is created equidistance from the magnets 18, 22 within the central bore 46. The magnetic field is amplified on the shaft of a tool within the bore 46 to magnetize the shaft and increase engagement between the tip of the shaft and a fastener.

Providing a magnetism booster assembly 10 on a tool advantageously boosts the magnetic coupling between the tip of the tool and a fastener. With the magnetism booster assembly 10, fasteners are less likely to be uncoupled or misaligned from the tip of a shaft while being driven into a workpiece or while being transported to the workpiece. For example, a user can place the fastener on the shaft and lift towards the ceiling or wall without worrying about the fastener falling to the ground. In addition, the magnetism booster assembly 10 allows for fasteners to be pulled out of bores of a workpiece easier.

Various features and advantages of the invention are set forth in the following claims.

What is claimed is:

1. A magnetism booster assembly comprising:
a body having a first end and a second end, the body defining a bore and a cavity formed separately from the bore, the bore extending between the first end and the second end, the cavity having a first opening adjacent the first end of the body and a second opening adjacent the second end of the body; and
a magnet positioned within the cavity.

2. The magnetism booster assembly of claim 1, wherein the cavity is partially defined by a back surface of the body, and wherein the second opening is adjacent the back surface.

3. The magnetism booster assembly of claim 1, wherein the body includes a protrusion extending into the bore, and wherein the protrusion is configured to engage a shaft of a tool.

4. The magnetism booster assembly of claim 1, wherein the cavity is a first cavity and the magnet is a first magnet, wherein the body further defines a second cavity formed separately from the bore and the first cavity, wherein the second cavity has a third opening adjacent the first end of the body and a fourth opening adjacent the second end of the body, and the magnetism booster assembly further comprising a second magnet positioned within the second cavity.

5. The magnetism booster assembly of claim 4, wherein the first cavity and the second cavity are positioned on diametrically opposite sides of the bore.

6. The magnetism booster assembly of claim 1, wherein the body is generally circular, and wherein the cavity has a generally rectangular cross-section.

7. The magnetism booster assembly of claim 1, wherein the first opening defines a lip that helps retain the magnet within the cavity.

8. The magnetism booster assembly of claim 1, wherein the second opening extends from the second end into the cavity.

9. A magnetism booster assembly comprising:
a body including a first end and a second end, the body defining a bore extending between the first end and the second end, the bore defining an axis and including an inner surface that extends continuously around the axis and defines a first portion of the bore, the body further including a protrusion that extends toward the axis from the inner surface and defines a second portion of the bore, the first portion of the bore having a first width, the second portion of the bore having a second width that is less than the first width; and
a magnet supported by the body.

10. The magnetism booster assembly of claim 9, wherein the protrusion extends circumferentially around the inner surface of the bore.

11. The magnetism booster assembly of claim 9, wherein the protrusion is a first protrusion positioned adjacent the first end of the body, and wherein the body further includes a second protrusion extending from the inner surface towards the axis, the second protrusion positioned adjacent the second end of the body.

12. The magnetism booster assembly of claim 11, wherein the second protrusion defines a third portion of the bore, the third portion having a third width, the third width being substantially equal to the second width.

13. The magnetism booster assembly of claim 9, wherein the protrusion extends from the inner surface towards the axis within a range between approximately 1 mm and 3 mm such that the first width is greater than the second width by between approximately 1 mm and 3 mm.

14. The magnetism booster assembly of claim 9, wherein the protrusion has a width measured parallel to the axis that is approximately 1 mm.

15. The magnetism booster assembly of claim 9, wherein the protrusion is flexible to accommodate a variety of tool shaft sizes and shapes.

16. A magnetism booster assembly comprising:
a body including a first end and a second end, the body defining a bore and a cavity, the cavity having an interior and an opening allowing access to the interior of the cavity, the opening having a width that is less than a width of the interior of the cavity; and
a magnet received in the interior of the cavity.

17. The magnetism booster assembly of claim 16, wherein the cavity is a first cavity, wherein the body further defines a second cavity that is substantially similar to the first cavity, and wherein the bore is positioned between the first cavity and the second cavity.

18. The magnetism booster assembly of claim 17, wherein the magnet is a first magnet, and the magnetism booster assembly further comprising a second magnet received in an interior of the second cavity.

19. The magnetism booster assembly of claim 18, wherein the first cavity, the second cavity, and the bore are formed separately from each other.

20. The magnetism booster assembly of claim 16, wherein the body is made of a silicone material, and wherein the silicone material has a hardness on the Shore A scale between durometer 50 and 60.

21. The magnetism booster assembly of claim 9, wherein the first portion and the second portion are axially offset from each other.

\* \* \* \* \*